(12) United States Patent
Wei

(10) Patent No.: US 12,259,658 B2
(45) Date of Patent: Mar. 25, 2025

(54) SEMICONDUCTOR DEVICE WITH GRATING STRUCTURE

(71) Applicant: NANYA TECHNOLOGY CORPORATION, New Taipei (TW)

(72) Inventor: Chun-Yen Wei, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 406 days.

(21) Appl. No.: 17/837,051

(22) Filed: Jun. 10, 2022

(65) Prior Publication Data
US 2023/0400777 A1 Dec. 14, 2023

(51) Int. Cl.
*G03F 7/00* (2006.01)

(52) U.S. Cl.
CPC ...... *G03F 7/70408* (2013.01); *G03F 7/70633* (2013.01)

(58) Field of Classification Search
CPC .................................................. G03F 7/70408
See application file for complete search history.

(56) References Cited

U.S. PATENT DOCUMENTS

| | | | | |
|---|---|---|---|---|
| 5,973,773 | A * | 10/1999 | Kobayashi | G03F 7/706 356/124 |
| 11,355,375 | B2 | 6/2022 | Volkovich et al. | |
| 2006/0126058 | A1* | 6/2006 | Nimmakayala | B82Y 10/00 356/614 |
| 2007/0287073 | A1* | 12/2007 | Goodwin | G03F 7/70316 430/5 |
| 2015/0331336 | A1* | 11/2015 | Quintanilha | G03F 7/70633 355/77 |
| 2021/0372776 | A1* | 12/2021 | Komaki | G03F 9/7042 |

FOREIGN PATENT DOCUMENTS

| | | |
|---|---|---|
| CN | 105070201 B | 12/2017 |
| CN | 114460816 A | 5/2022 |
| TW | I473964 B | 2/2015 |

OTHER PUBLICATIONS

Office Action and Search Report mailed on Feb. 21, 2024 related to Taiwanese Application No. 112101656.

* cited by examiner

*Primary Examiner* — William A Harriston
(74) *Attorney, Agent, or Firm* — Xuan Zhang

(57) ABSTRACT

The present application discloses a semiconductor device with a grating structure. The semiconductor device includes a first target positioned on a first layer and including a plurality of line features spaced equally apart from each other according to a first pitch; and a second target positioned on a second layer and including a plurality of line features spaced equally apart from each other according to a second pitch. The first layer is different from the second layer. The first target and the second target do not overlap with each other. The first target is configured to generate an interference pattern when being illuminated by a lens including a grating configured thereon. The second target is configured to generate an interference pattern when being illuminated by the lens including the grating configured thereon.

13 Claims, 15 Drawing Sheets

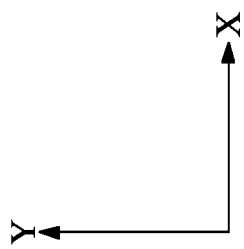
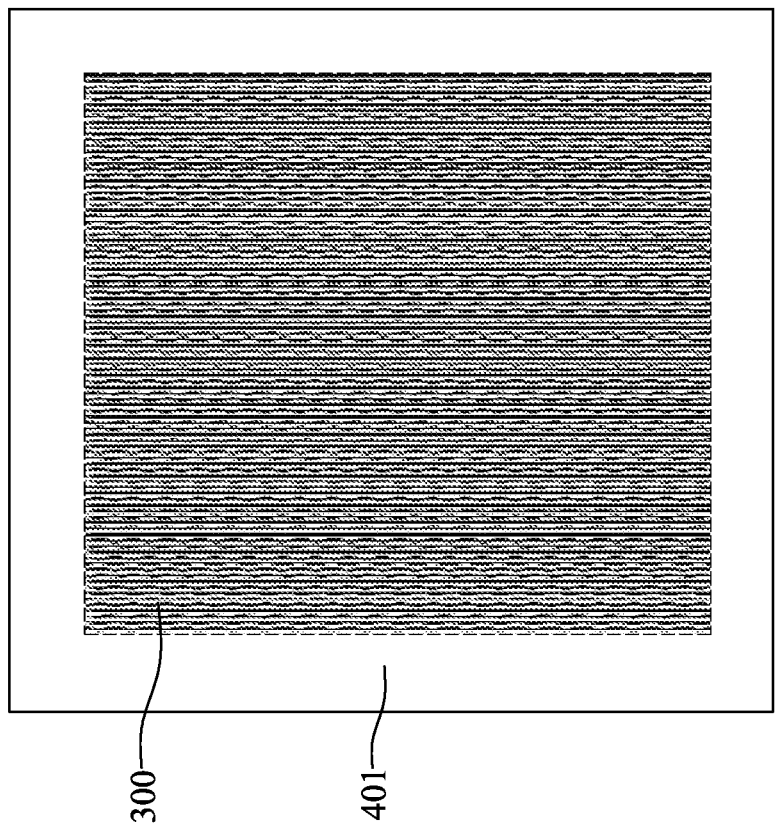
FIG. 7

SEMICONDUCTOR DEVICE WITH GRATING STRUCTURE

TECHNICAL FIELD

The present disclosure relates to a semiconductor device with a grating structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a target structure including a first target positioned on a first layer and including a plurality of line features spaced equally apart from each other according to a first pitch; and a second target positioned on a second layer and including a plurality of line features spaced equally apart from each other according to a second pitch. The first layer is different from the second layer. The first target and the second target do not overlap with each other. The first target is configured to generate an interference pattern when being illuminated by a lens including a grating configured thereon. The second target is configured to generate an interference pattern when being illuminated by the lens including the grating configured thereon.

Another aspect of the present disclosure provides a method for overlay measurement including forming a first target on a first layer; forming a second target on a second layer different from the first layer, wherein the first target and the second target are not overlapped to each other; positioning a lens including a grating configured thereon at a first location to completely overlap with the first target and the second target to generate an interference pattern of the first target and an interference pattern of the second target; and determining an overlay between the first target and the second target through the interference pattern of the first target and the interference pattern of the second target.

Another aspect of the present disclosure provides an image based metrology system for overlay measurement including a lens including a grating configured thereon; a light source to provide illumination to the lens; a detector to collect data; and a processing unit to process the data. The grating is configured to overlap with a first target having a first pitch and a second target having a second pitch to generate an interference pattern of the first target and an interference pattern of the second target.

Due to the design of the image based metrology system and the target of the present disclosure, the first target and the second target do not need to overlap with each other. Hence, the effect of process deviation for different layers to the targets may be reduced and a less complex design rule may be applied. In addition, the lens may be shifted for multiple times to obtain multiple overlay results. All the overlay results may be used to validate each other and may be used to obtain an (average) overlay to fulfill statistical requirements.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7 illustrates, in a schematic top-view diagram, the lens in accordance with one embodiment of the present disclosure;

DETAILED DESCRIPTION

Figure 1:
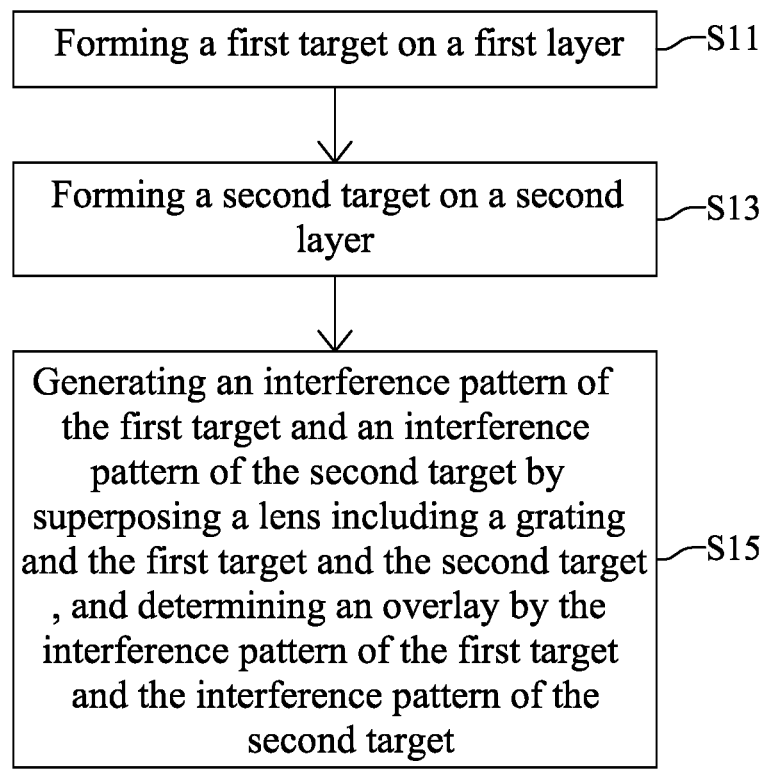
FIG. 1 illustrates, in a flowchart diagram form, a method for determining an overlay in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, in the description of the present disclosure, above (or up) corresponds to the direction of the arrow of the direction Z, and below (or down) corresponds to the opposite direction of the arrow of the direction Z.

Figure 2:
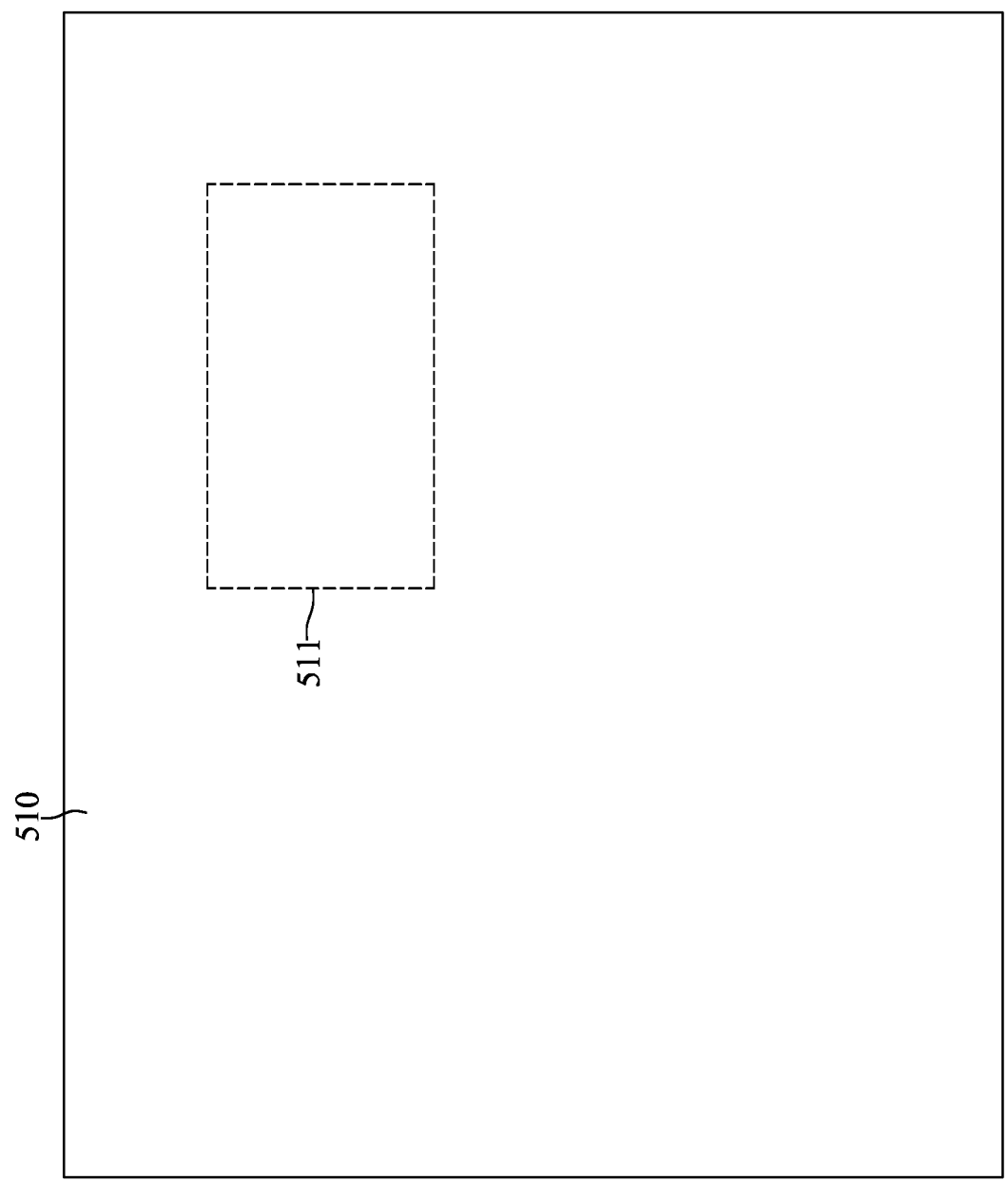
FIG. 2 illustrates, in a schematic top-view diagram, a first mask for fabricating a first target in accordance with one embodiment of the present disclosure.
Figure 3:
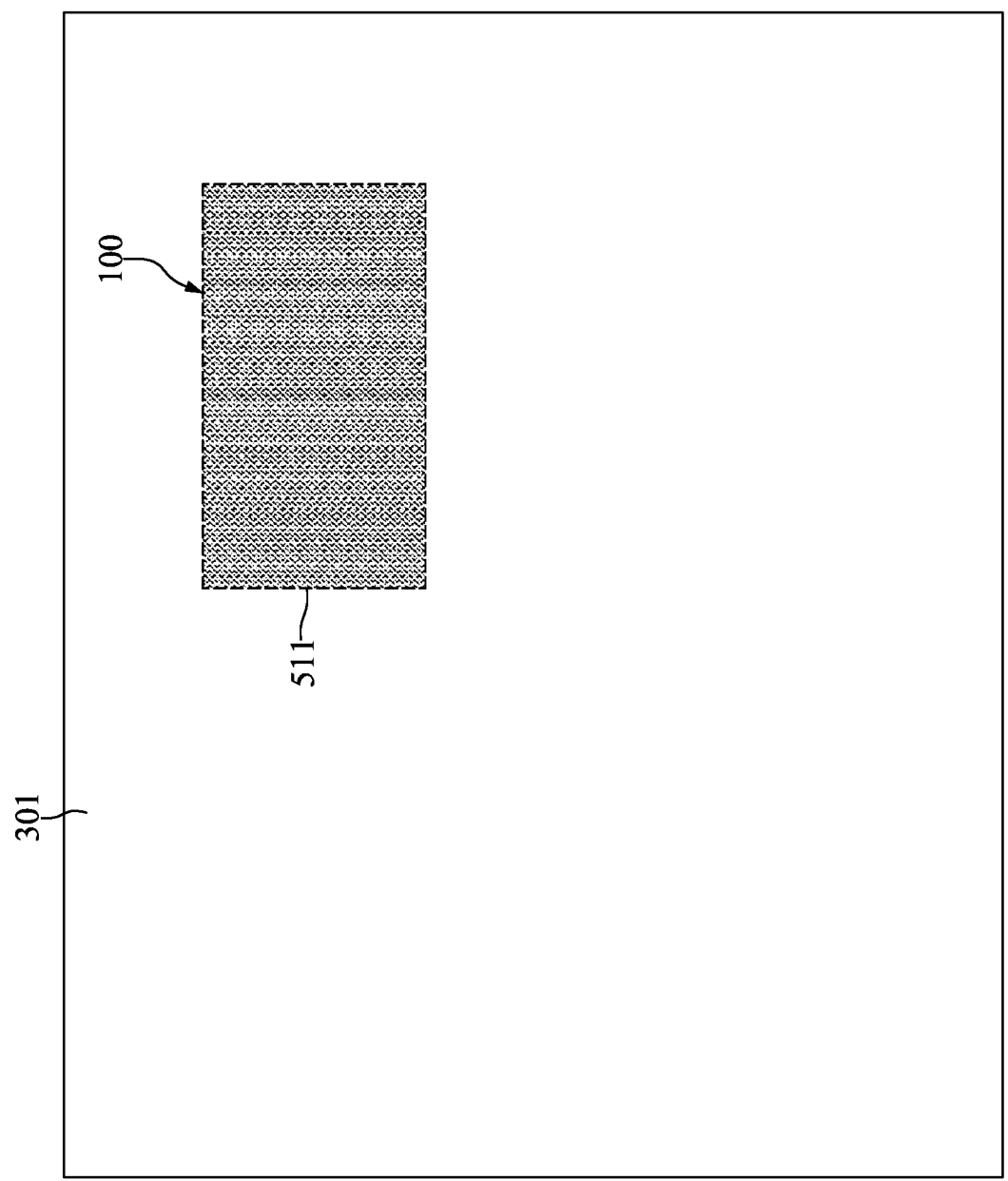
FIG. 3 illustrates, in a schematic top-view diagram, the first target fabricated using the first mask in accordance with one embodiment of the present disclosure.

FIG. 1 illustrates, in a flowchart diagram form, a method 10 for determining an overlay in accordance with one embodiment of the present disclosure. FIG. 2 illustrates, in a schematic top-view diagram, a first mask 510 for fabricating a first target 100 in accordance with one embodiment of the present disclosure. FIG. 3 illustrates, in a schematic top-view diagram, the first target 100 fabricated using the first mask 510 in accordance with one embodiment of the present disclosure.

Fabrication of semiconductor device generally involves the formation of multiple integrated circuit patterns on one or more layers over a substrate wafer. These integrated circuit patterns generally include numerous regions formed through photolithography. Photolithography uses masks comprising patterns to define regions on a substrate. For example, with photolithography, a photoresist layer is formed on a substrate, and is exposed to radiation, such as ultraviolet light, deep ultraviolet, or extreme ultraviolet, which is transmitted through transparent areas of the mask to cause a chemical reaction in corresponding regions of the photoresist. The photoresist is then developed to produce a pattern of open areas that expose the underlying material, with the other areas of the material still protected by the photoresist. Depending on whether a positive or negative tone resist is used, the exposed or unexposed portions of the photoresist layer are removed. The portions of the substrate not protected by the photoresist are then etched to form the features in the substrate. The relative positioning and alignment, or "overlay," between masks controls whether the resultant semiconductor device are formed properly. Minimizing overlay error is a significant concern in the manufacturing of the semiconductor device. Overlay metrology minimizes overlay errors by using an overlay target in the same layer as the functional circuit structure.

With reference to FIGS. 1 to 3, at step S11, the first target 100 may be formed on a first layer 301.

With reference to FIG. 2, the first mask 510 may be provided. The first mask 510 may have a pattern of the first target 100 at the first position 511. It should be noted that the detail structure of the pattern is omitted for clarity.

With reference to FIG. 3, the pattern of the first mask 510 may be transferred onto a first layer 301 by a photolithography process to form the first target 100. The first target 100 may be located at the first position 511 and include a plurality of line features spaced equally apart from each other. The plurality of line features (also referred to as first features) may occur at a first pitch (e.g., spacing, frequency, occurrence, etc.). For example, each of the plurality of line features of the first target 100 may extend along the direction Y and the plurality of line features of the first target 100 may occur repeatedly along the direction X.

In some embodiments, the first pitch is less than a minimum optical resolution of an image based metrology system which will be illustrated later. In other words, the first pitch may be unresolvable by the image based metrology system. The small first pitch of the first target 100 may imply that the size of the first target 100 may be reduced to save real estate for metrology and provide more space for functional circuits.

Figure 4:
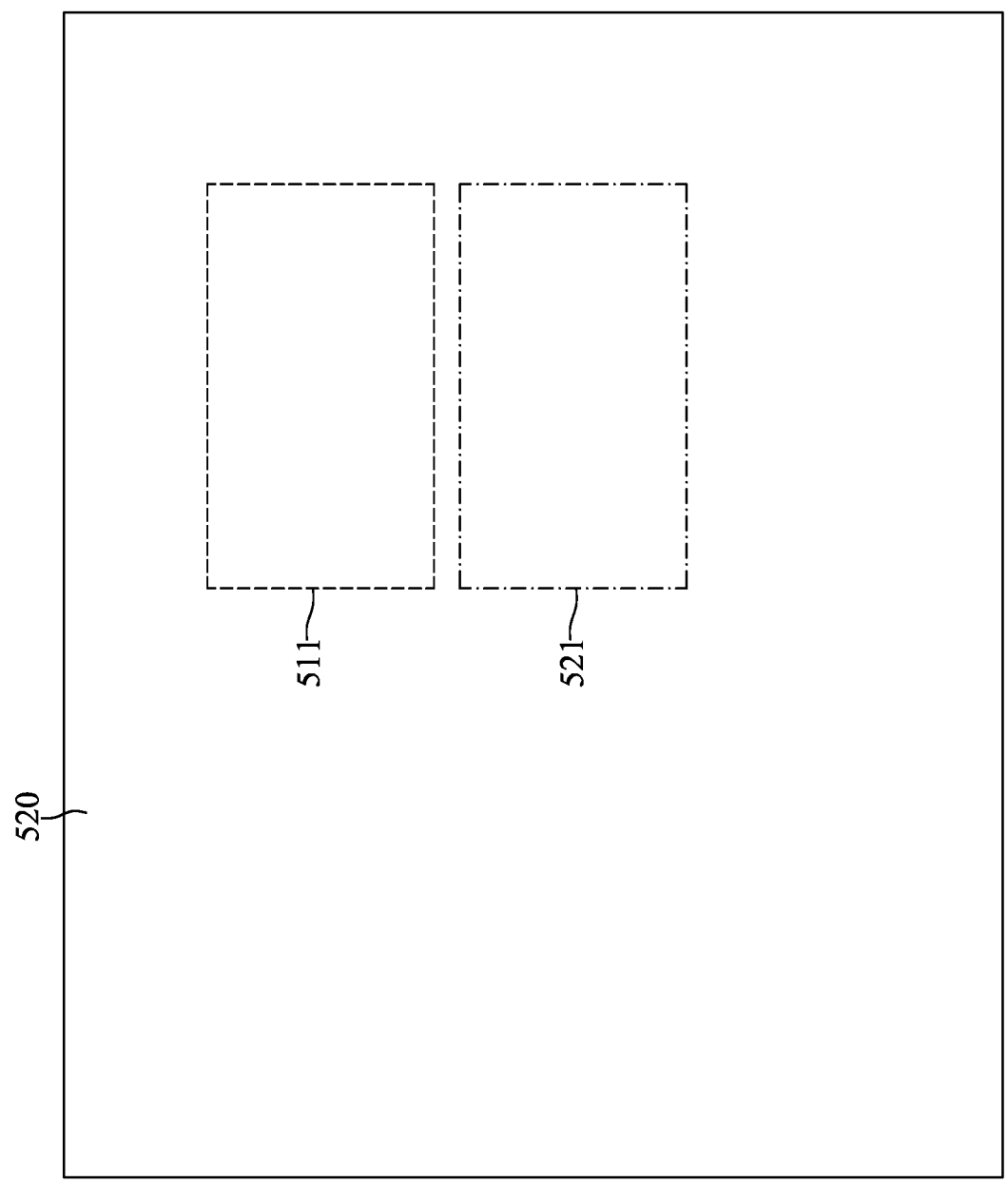
FIG. 4 illustrates, in a schematic top-view diagram, a second mask for fabricating a second target in accordance with one embodiment of the present disclosure.
Figure 5:
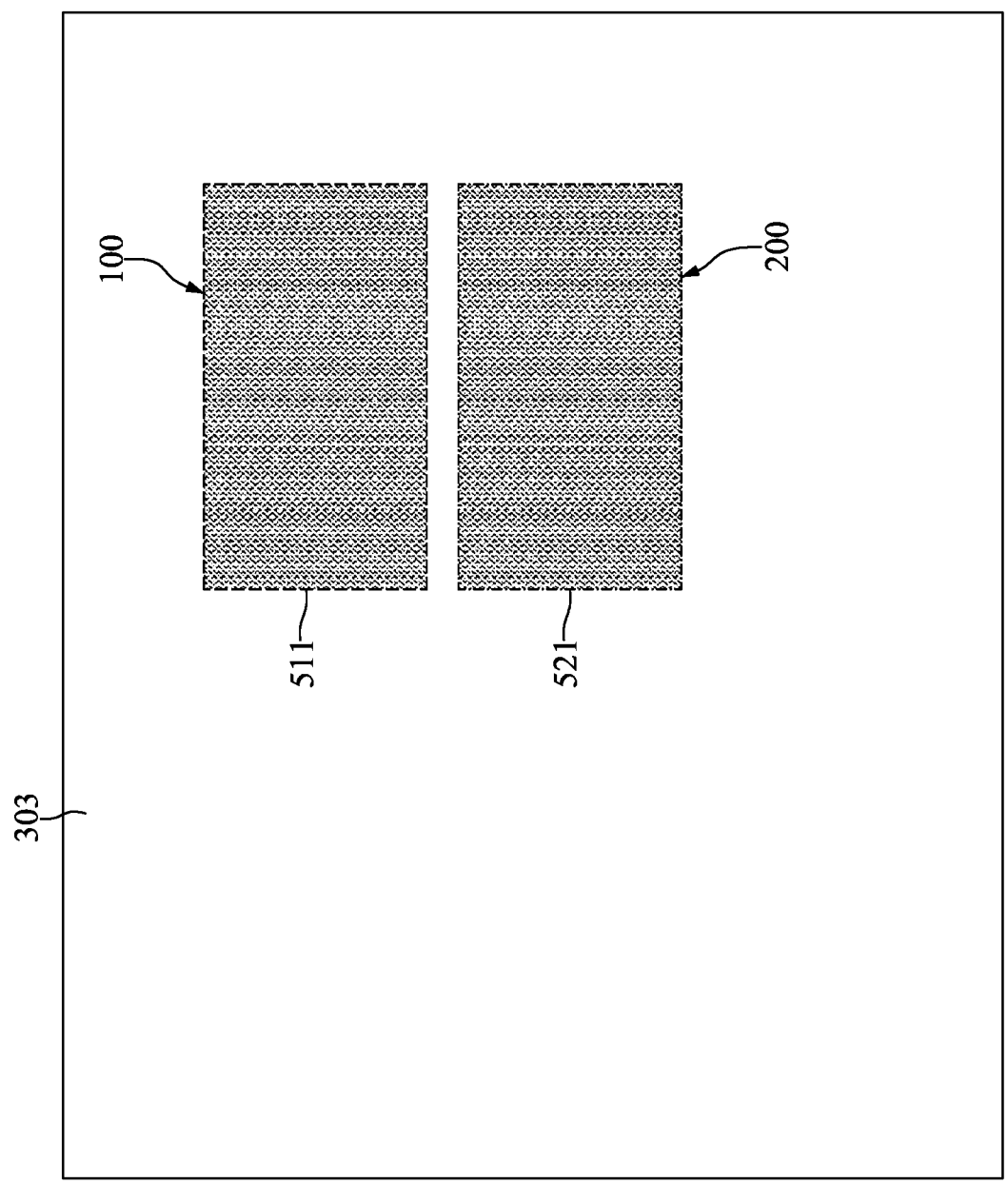
FIG. 5 illustrates, in a schematic top-view diagram, the second target fabricated using the second mask in accordance with one embodiment of the present disclosure.

FIG. 4 illustrates, in a schematic top-view diagram, a second mask 520 for fabricating a second target 200 in accordance with one embodiment of the present disclosure. FIG. 5 illustrates, in a schematic top-view diagram, the second target 200 fabricated using the second mask 520 in accordance with one embodiment of the present disclosure.

With reference to FIGS. 1, 4, and 5, at step S13, the second target 200 may be formed on a second layer 303.

With reference to FIG. 4, the second mask 520 may be provided. The second mask 520 may have a pattern of the second target 200 at the second position 521. When the first mask 510 and the second mask 520 are aligned, the second position 521 may be adjacent to the first position 511. For example, the second position 521 may be adjacent to the first position 511 along the direction Y.

In some embodiments, the first position 511 and the second position 521 are immediately adjacent to each other so that the targets fabricated using the masks 510, 520 may be immediately adjacent to each other. It should be noted that the term "immediately adjacent" mean two target are spaced apart from one another (in the direction parallel to the lines and gaps in the target) a close enough distance to allow optical comparison (that is, for example, equal to less than 50 times, less than 25 times, less than 10 times, etc., the width of the parallel lines (or the gaps) in the target) and may be spaced as closely as just a few (e.g., 5) of the gaps. Thus, the targets are spaced close enough to one another but still allow optical observation individually.

With reference to FIG. 4, the second position 521 and the first position 511 may be aligned to each other. For example, the left side of the second position 521 and the left side of the first position 511 may be aligned to the same line which is parallel to the direction Y.

It should be noted that the detail structure of the pattern are omitted for clarity and the first position 511 is shown for illustrating the position relationship with the second position 521.

With reference to FIG. 5, the pattern of the second mask 520 may be transferred onto the second layer 303, which is different from the first layer 301, by a photolithography process to form the second target 200. The second target 200 may be located at the second position 521 and adjacent to (or immediately adjacent to) the first target 100 located at the first position 511. The second target 200 may include a plurality of line features spaced equally apart from each other. The plurality of line features (also referred to as second features) may occur at a second pitch. For example, each of the plurality of line features of the second target 200 may extend along the direction Y and the plurality of line features of the second target 200 may occur repeatedly along the direction X.

In some embodiments, the second pitch is less than the minimum optical resolution of the image based metrology system. In other words, the second pitch may be unresolvable by the image based metrology system. The small second pitch of the second target 200 may imply that the size of the second target 200 may be reduced to save real estate for metrology and provide more space for functional circuits.

In the present embodiment, the first pitch and the second pitch may be the same. That is, ideally, the first target 100 and the second target 200 may be aligned. The center of gravity (COG) of the first target 100 and the center of gravity of the second target 200 are along the same line which is parallel to the direction Y. In other words, the very center (for example a line or a gap) of the first target 100 are along the same line (in the direction Y) as the very center of the second target 200.

Figure 6:
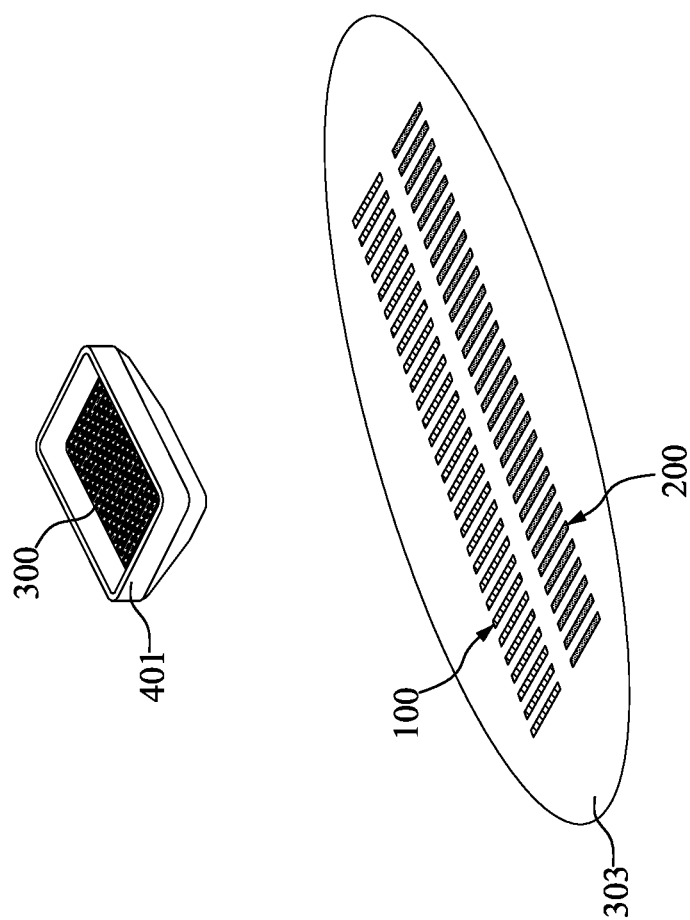
FIG. 6 illustrates, in a schematic diagram, a lens of an image based metrology system measuring the first target and the second target in accordance with one embodiment of the present disclosure.
Figure 8:
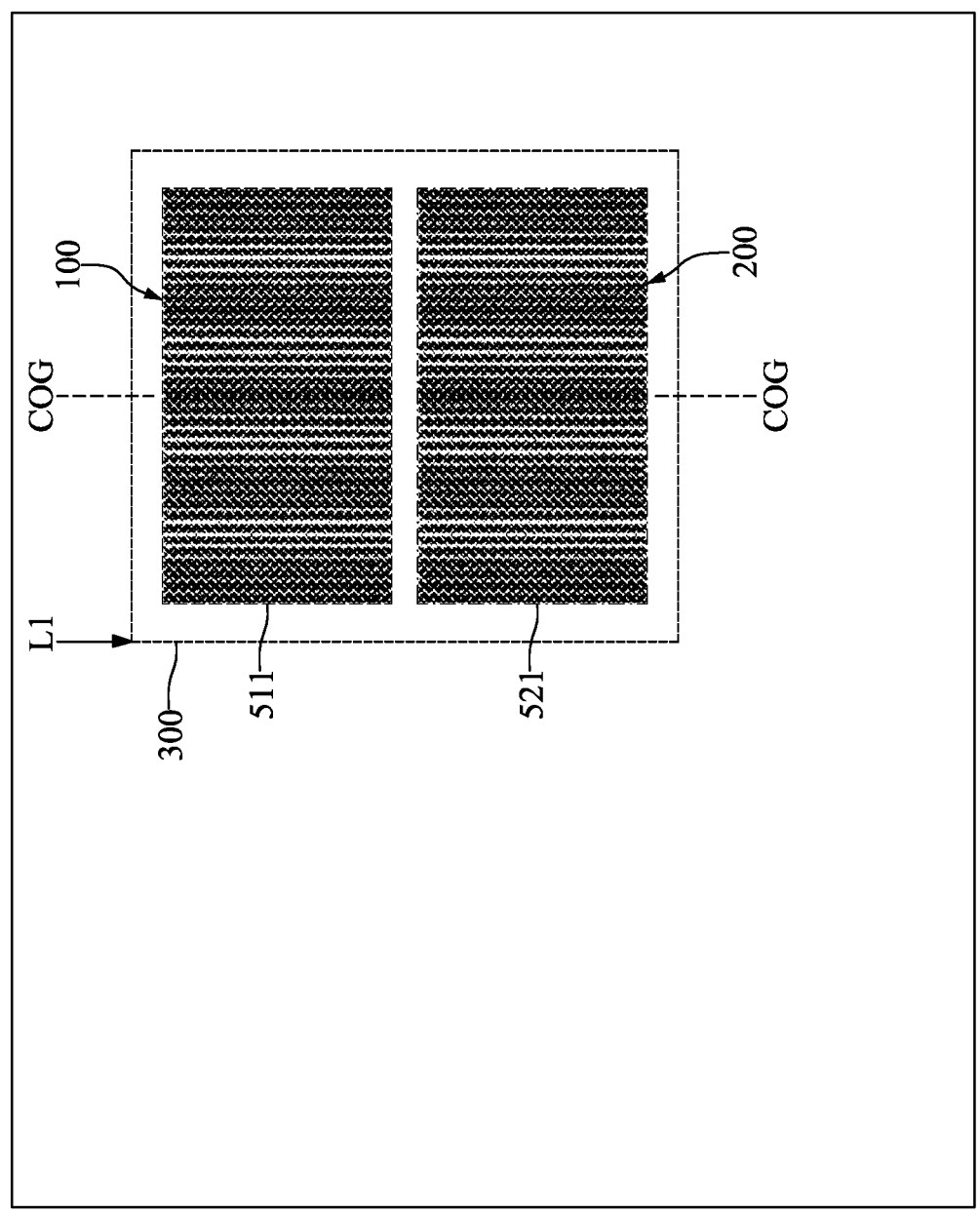
FIG. 8 illustrates, in a schematic top-view diagram, interference patterns of the first target and the second target without overlay error in accordance with one embodiment of the present disclosure.
Figure 9:
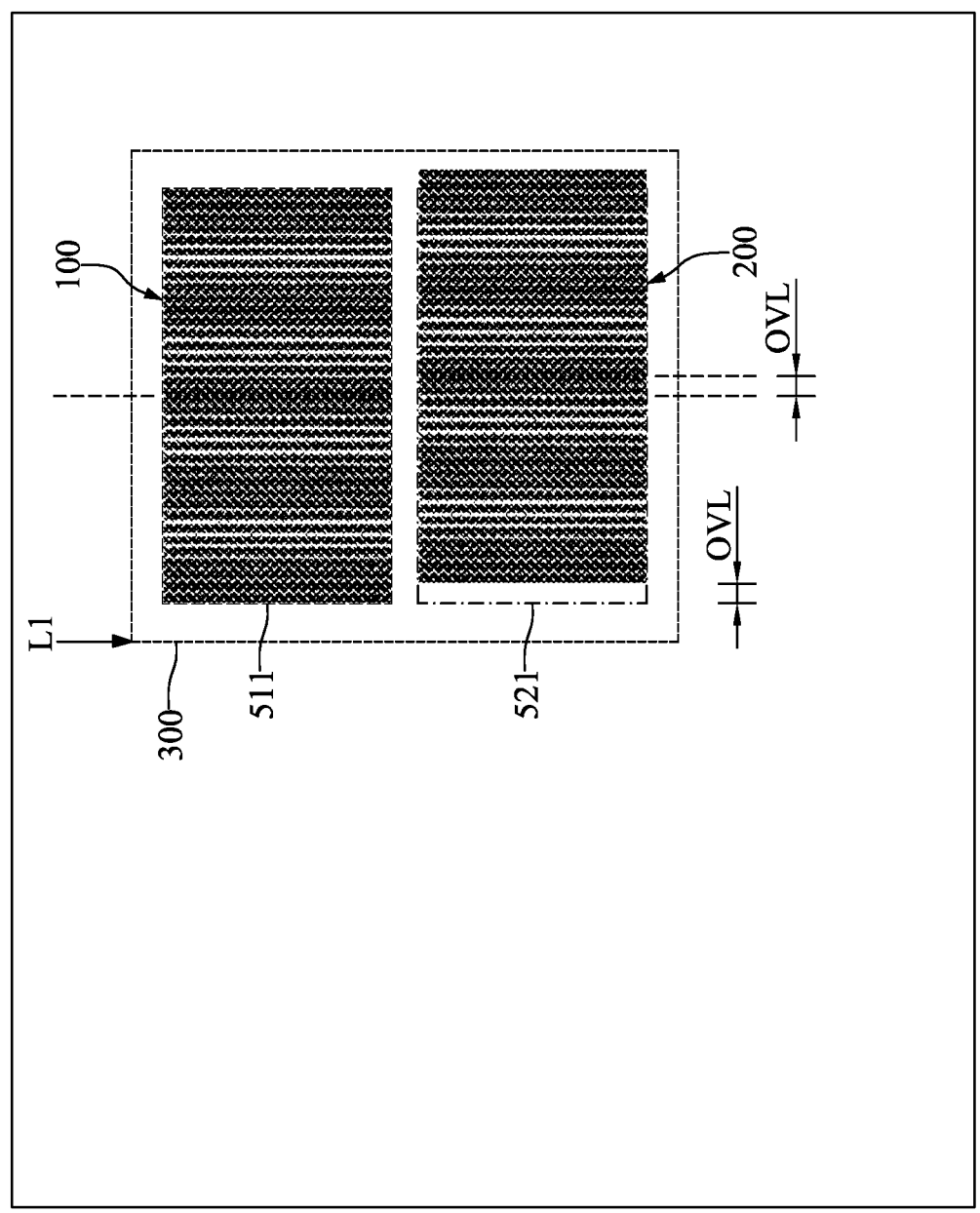
FIG. 9 illustrates, in a schematic top-view diagram, interference patterns of the first target and the second target with an overlay error in accordance with one embodiment of the present disclosure.

FIG. 6 illustrates, in a schematic diagram, a lens 401 of an image based metrology system measuring the first target 100 and the second target 200 in accordance with one embodiment of the present disclosure. FIG. 7 illustrates, in a schematic top-view diagram, the lens 401 in accordance with one embodiment of the present disclosure. FIG. 8 illustrates, in a schematic top-view diagram, interference patterns of the first target 100 and the second target 200 without overlay error in accordance with one embodiment of the present disclosure. FIG. 9 illustrates, in a schematic top-view diagram, interference patterns of the first target 100 and the second target 200 with an overlay error in accordance with one embodiment of the present disclosure.

With reference to FIG. 1 and FIGS. 6 to 9, at step S15, a lens 401 including a grating 300 may superpose the first target 100 and the second target 200 to generate an interference pattern of the first target 100 and an interference pattern of the second target 200, and an overlay may be determined by the interference pattern of the first target 100 and the interference pattern of the second target 200.

With reference to FIGS. 6 and 7, the first target 100 and the second target 200 may be measured (or observed) by the image based metrology system to determine the overlay of features (e.g., the first features and the second features) between different layers (e.g., the first layer 301 and the second layer 303). The image based metrology system may include the lens 401. The lens 401 may include the grating 300 configured thereon. The grating 300 may include a plurality of line features spaced equally apart from each other. In some embodiments, the plurality of line features of the grating 300 may be parallel to the plurality of line features of the first target 100 or the plurality of line features of the second target 200. The pitch of the grating 300 may be slightly different from the first pitch of the first target 100 and the second pitch of the second target 200. In some embodiments, the pitch of the grating 300 may be greater than the first pitch of the first target 100 and the second pitch of the second target 200. In some embodiments, the pitch of the grating 300 may be less than the first pitch of the first target 100 and the second pitch of the second target 200.

Generally, the lens 401 may be placed over the first target 100 and the second target 200 during measuring so that the grating 300 may be superposed with the first target 100 and the second target 200 to generate (or construct) the interference pattern of the first target 100 and the interference pattern of the second target 200, respectively and correspondingly. Not bound by a particular theory, it is believed that the interference patterns of the first target 100 and the second target 200 may be formed due to the moiré effect.

In some embodiments, the grating 300 may be formed separately and then be transferred onto the lens 401. In some embodiments, the grating 300 may be generated by one or more refractive spatial light modulator.

In some embodiments, the image based metrology system may include a light source (not shown) such as a Xenon Arc lamp and/or a Deuterium lamp, and/or light emitting diode (s) to provide illumination to the lens 401. In some embodiments, the image based metrology system may include a detector (not shown) such as a charge-coupled device array to collect the generated interference patterns. In some embodiments, the image based metrology system may include a processing unit (not shown) to process the collected images and determine an overlay error.

With reference to FIG. 8, the interference pattern of the first target 100 (also referred to as the first interference pattern of the first target 100) and the interference pattern of the second target 200 (also referred to as the first interference pattern of the second target 200) are shown. The dashed line shows the grating 300 which is disposed at the first location L1 (also referred to as the origin of the lens 401). It should be noted that the line features of the grating 300 are not shown for clarity.

With reference to FIG. 8, the kernels (the dark areas between the light areas) in the interference patterns of the first target 100 and the second target 200 may be greater than the minimum optical resolution of the image based metrology system. In other words, the kernels of the interference patterns of the first target 100 and the second target 200 may be resolvable by the image based metrology system. In some embodiments, the pitch of the interference patterns of the first target 100 and the second target 200 may be maintained small enough to accommodate, for example, at least five pitches in one target, to ensure the precision of the interference patterns of the first target 100 and the second target 200.

Due to that the first pitch of the first target 100, the second pitch of the second target 200, and the pitch of the grating 300 are unresolvable to the image based metrology system and the pitch of the interference patterns of the first target 100 and the second target 200 are resolvable to the image based metrology system, the interference between the first target 100, the second target 200, and the grating 300 to the interference patterns of the first target 100 and the second target 200 may be minimized. As a result, the pitch contrast of the interference patterns of the first target 100 and the second target 200 may be improved.

In some embodiments, by comparing the center of gravity of the interference pattern of the first target 100 and the center of gravity of the interference pattern of the second target 200, the overlay between the first target 100 and the second target 200 may be determined.

In some embodiments, since the moiré effect is sensitive to phase shift, the difference between the pitch of the grating 300 and the first pitch of the first target 100 and the second pitch of the second target 200 may shift according to the relative displacements of the grating 300 and the first target 100 and according to the relative displacements of the grating 300 and the second target 200. Hence, the grating 300 may serve as an anchor (i.e., a reference). The relative displacement of the interference pattern generated for the first target 100 located on the first layer 301 and the relative displacement of the interference pattern generated for the second target 200 located on the second layer 303 may be utilized to indicate the overlay. That is, the overlay is measured based on the relative displacement of different targets against the same grating 300 configured on the lens 401 instead of being measured based on any particular location (e.g., a center location) identified by the target.

With reference to FIG. 8, the first target 100 and the second target 200 are perfectly aligned. In other words, the first target 100 may be formed in the proper position (i.e., the first position 511) according to the proper pitch and the second target 200 may be formed in the proper position (i.e., the second position 521) according to the proper pitch. Due to the prefect alignment of the first target 100 and the second target 200, the center of gravity of the interference pattern of the first target 100 and the center of gravity of the interference pattern of the second target 200 may be aligned so that there is no overlay error in FIG. 8.

With reference to FIG. 9, the first target 100 and the second target 200 are not aligned. For example, the first target 100 may be formed in the proper position (i.e., the first position 511) according to the proper pitch; however, the second target 200 may be formed in a deviated position (i.e., shift from the second position 521) or may be formed in a deviated pitch. As a result, the center of gravity of the interference pattern of the first target 100 and the center of gravity of the interference pattern of the second target 200 may be misaligned so that an overlay (OVL) is measured in FIG. 9.

By employing the grating 300 configured on the lens 401 of the image based metrology system, the first target 100 and the second target 200 do not need to overlap with each other. Hence, the effect of process deviation for different layers to the targets may be reduced and a less complex design rule may be applied.

Figure 10:
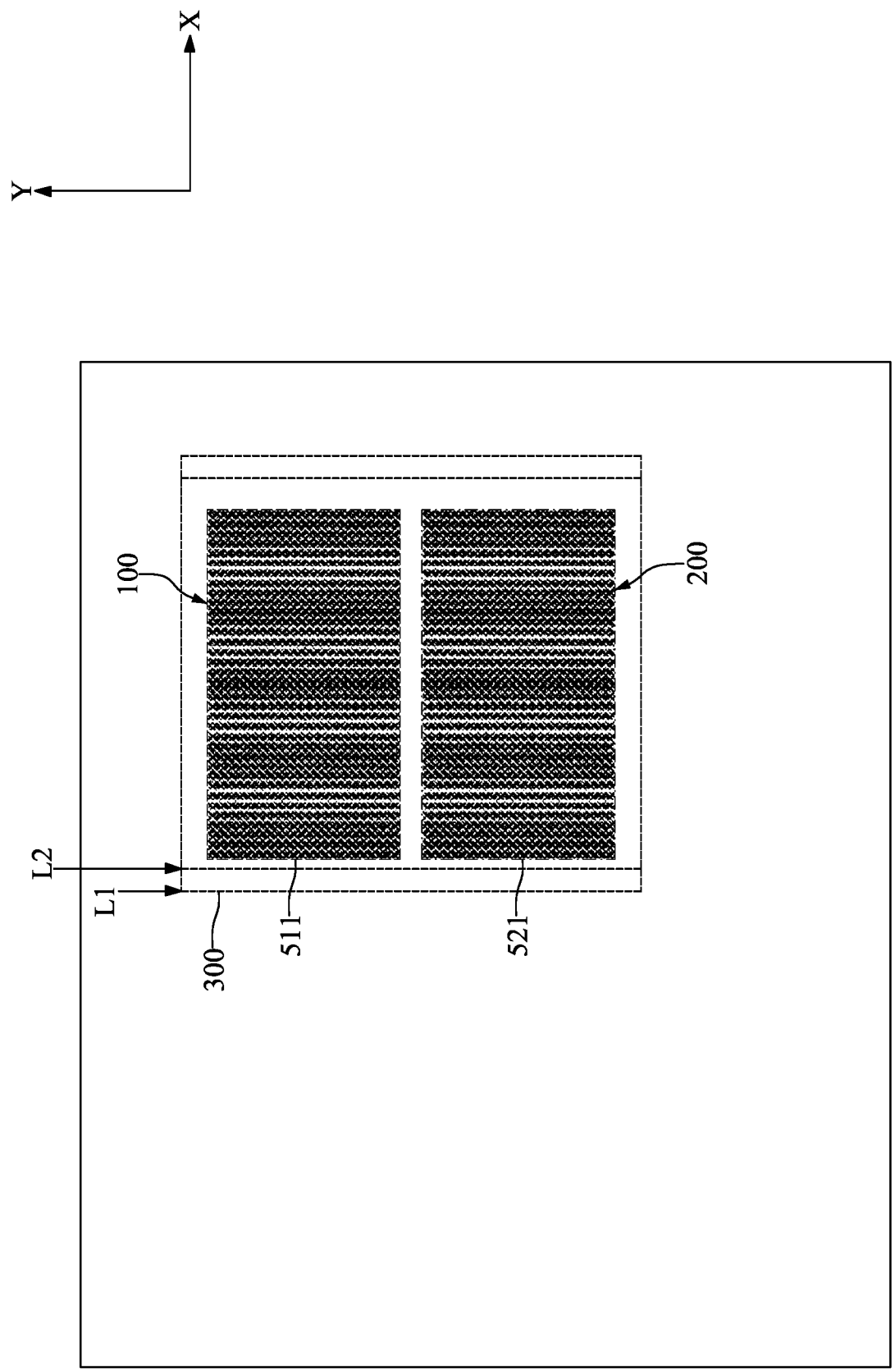
FIG. 10 illustrates, in a schematic top-view diagram, determining an overlay after a shifting of the lens in accordance with one embodiment of the present disclosure.

FIG. 10 illustrates, in a schematic top-view diagram, determining an overlay after a shifting of the lens 401 in accordance with one embodiment of the present disclosure.

With reference to FIG. 10, the lens 401 may be shifted along the direction X to a second location L2. Due to the shift of the lens 401, the grating 300 and the first target 100 may generate a second interference pattern of the first target 100. The grating 300 and the second target 200 may generate a second interference pattern of the second target 200. The second interference pattern of the first target 100 and the second interference pattern of the second target 200 may be used to determine an overlay obtained at the second location L2. The overlay obtained at the second location L2 and the overlay obtained at the first location L1 may be used to calculate an average overlay. Accordingly, the lens 401 may be shifted for multiple times to obtain multiple overlay results. All the overlay results may be used to validate each other and may be used to obtain an (average) overlay to fulfill statistical requirements.

Figure 11:
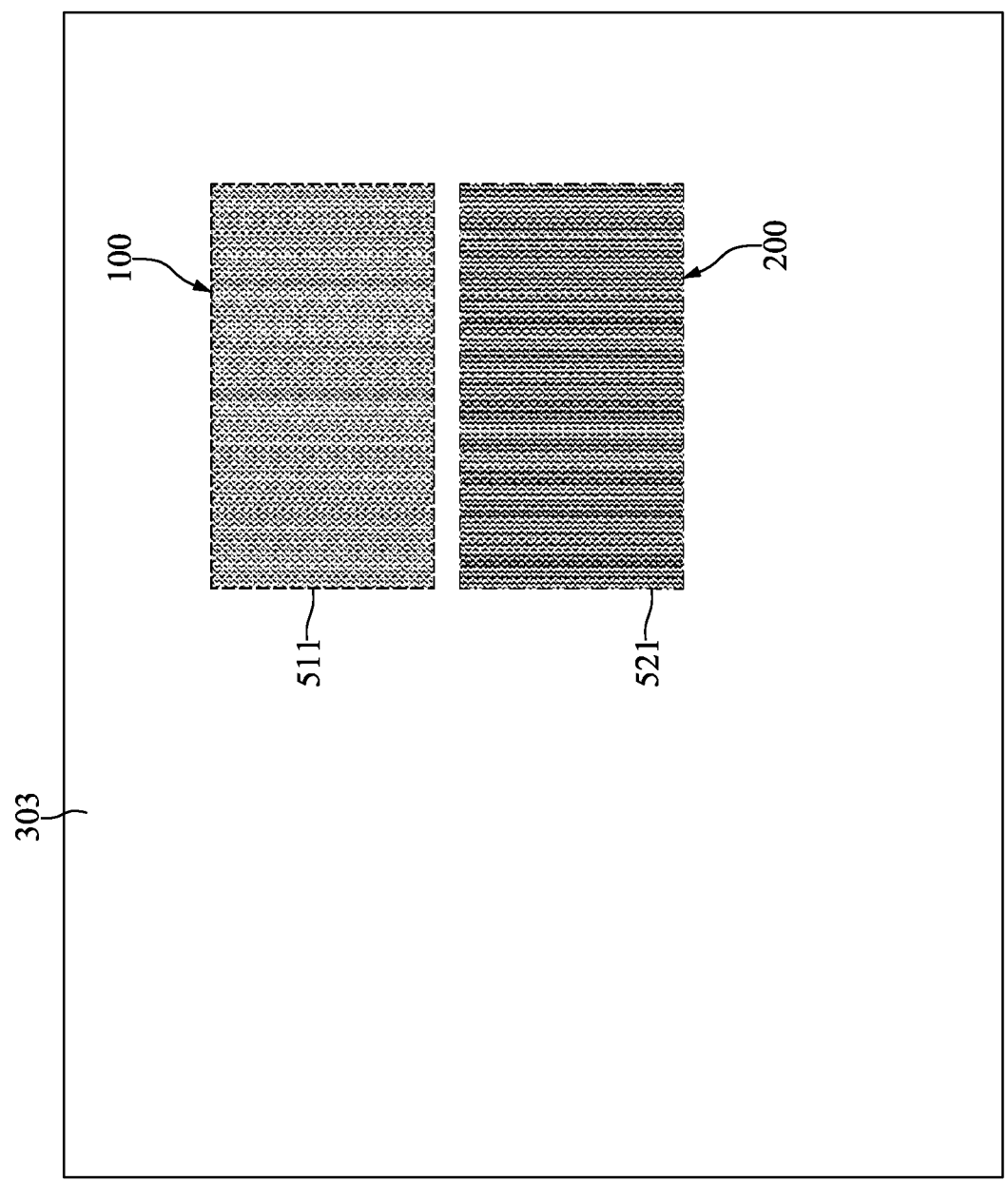
FIG. 11 illustrates, in a schematic top-view diagram, the first target and the second target in accordance with another embodiment of the present disclosure.

FIG. 11 illustrates, in a schematic top-view diagram, the first target 100 and the second target 200 in accordance with another embodiment of the present disclosure.

With reference to FIG. 11, the first pitch of the first target 100 and the second pitch of the second target 200 may be different. For example, the first pitch of the first target 100 may be greater than the second pitch of the second target 200. For another example, the first pitch of the first target 100 may be less than the second pitch of the second target 200. The difference between the first pitch of the first target 100 and the second pitch of the second target 200 can cause a magnification of the interference pattern of the first target 100 and the interference pattern of the second target 200, assuming no distortion is created by the manufacturing process.

In some embodiments, the first pitch of the first target 100 may be set to relative to the second pitch of the second target 200 to balance the strength of reflection of the first target 100 and reflection of the second target 200 to improve the pitch contrast of the interference patterns of the first target 100 and the second target 200. The strength of reflection may be determined based on sizes (e.g., critical dimension) of the line features in the first target 100 and the second target 200, and based on the transparency, thickness, surface texture/reflectivity, geometries etc., of the materials of the first layer 301 and the second layer 303.

Figure 12:
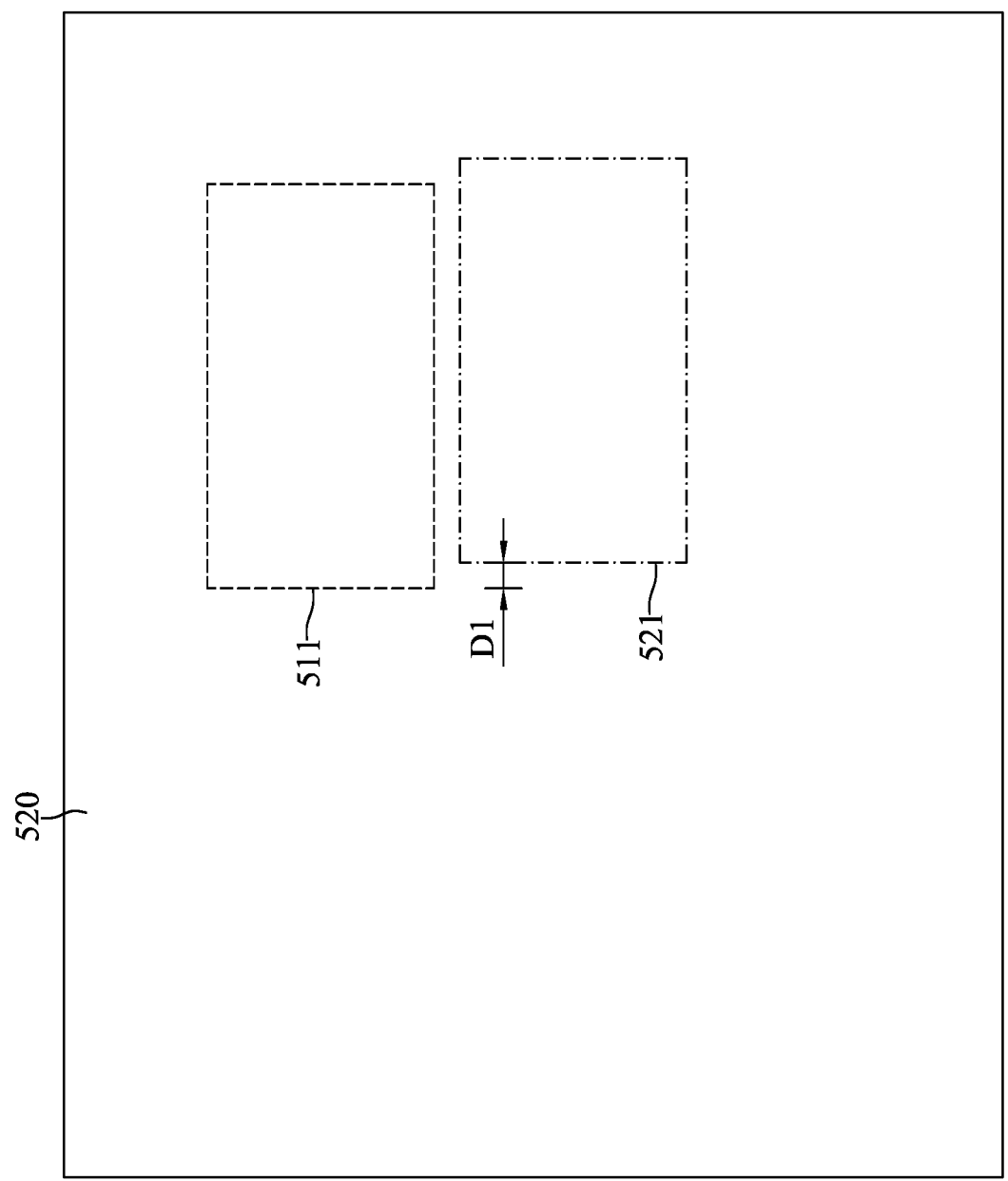
FIG. 12 illustrates, in a schematic top-view diagram, a second mask for fabricating a second target in accordance with another embodiment of the present disclosure.
Figure 13:
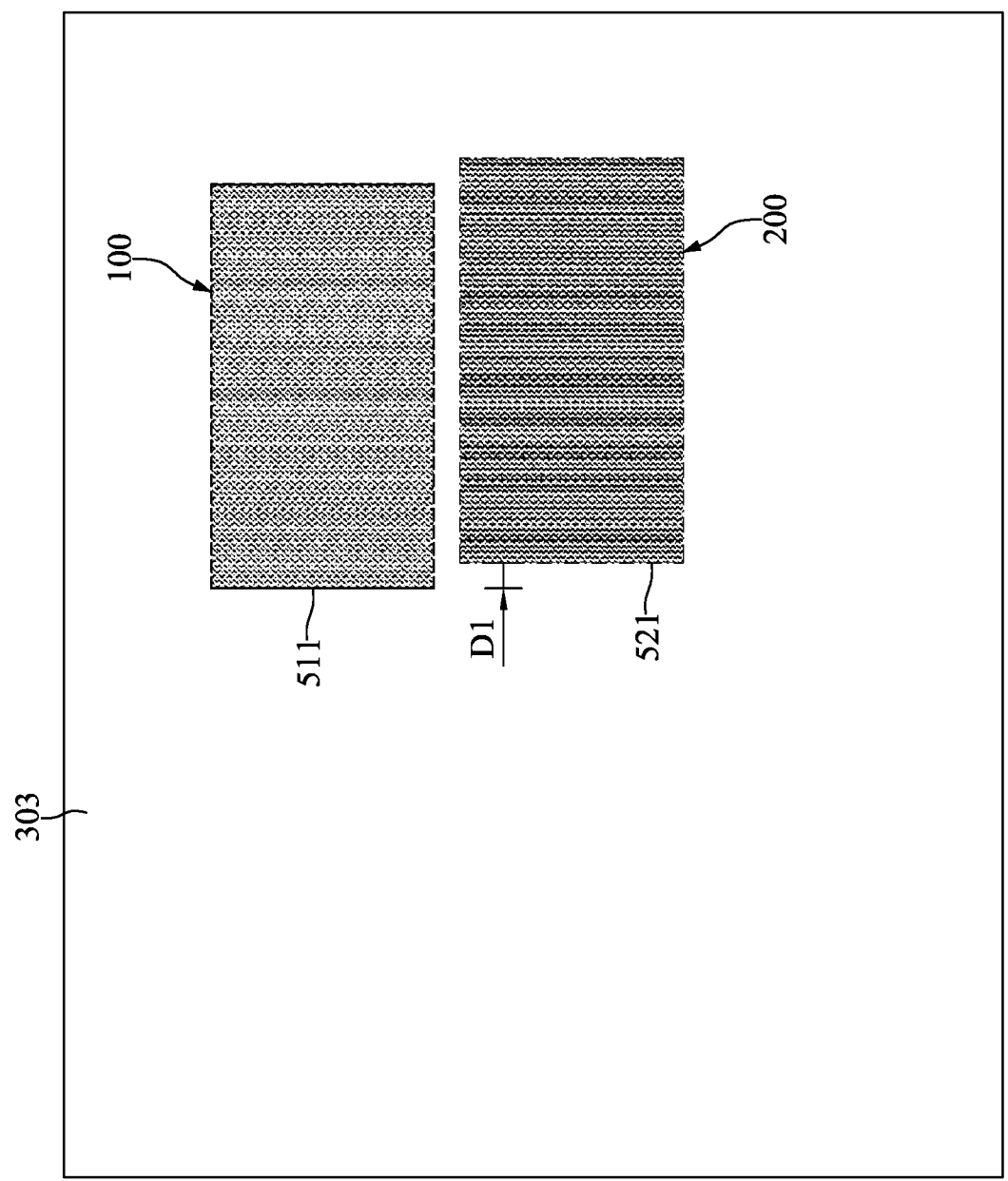
FIG. 13 illustrates, in a schematic top-view diagram, the second target fabricated using the second mask in accordance with another embodiment of the present disclosure.

FIG. 12 illustrates, in a schematic top-view diagram, a second mask 520 for fabricating a second target 200 in accordance with another embodiment of the present disclosure. FIG. 13 illustrates, in a schematic top-view diagram, the second target 200 fabricated using the second mask 520 in accordance with another embodiment of the present disclosure.

With reference to FIG. 12, the second mask 520 may have a pattern of the second target 200 at the second position 521. When the first mask 510 and the second mask 520 are aligned, the second position 521 may be adjacent to the first position 511. For example, the second position 521 may be adjacent to or immediately adjacent to the first position 511 along the first direction. The second position 521 may be intentionally shifted a distance D1 along the direction X relative to the first position 511. In other words, the left side of the second position 521 and the left side of the first position 511 may be misaligned.

With reference to FIG. 13, the second target 200 may be formed using the second mask 520. The second target 200 may be located at the second position 521 and deviated from the first target 100 located at the first position 511 in the distance D1. In the present embodiment, the first pitch of the first target 100 and the second pitch of the second target 200 may be different.

Figure 14:
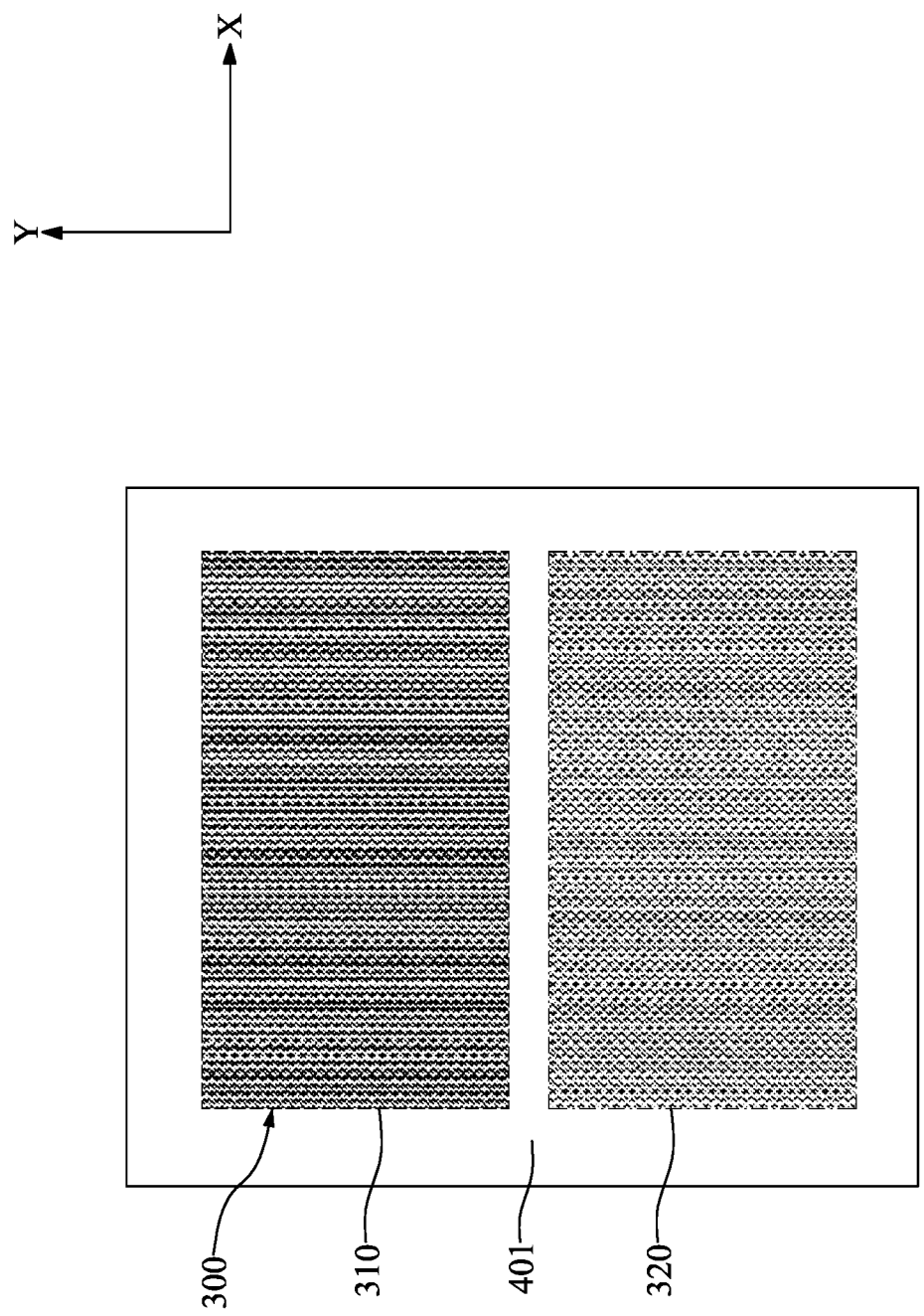
FIG. 14 illustrates, in a schematic top-view diagram, a lens in accordance with another embodiment of the present disclosure.
Figure 15:
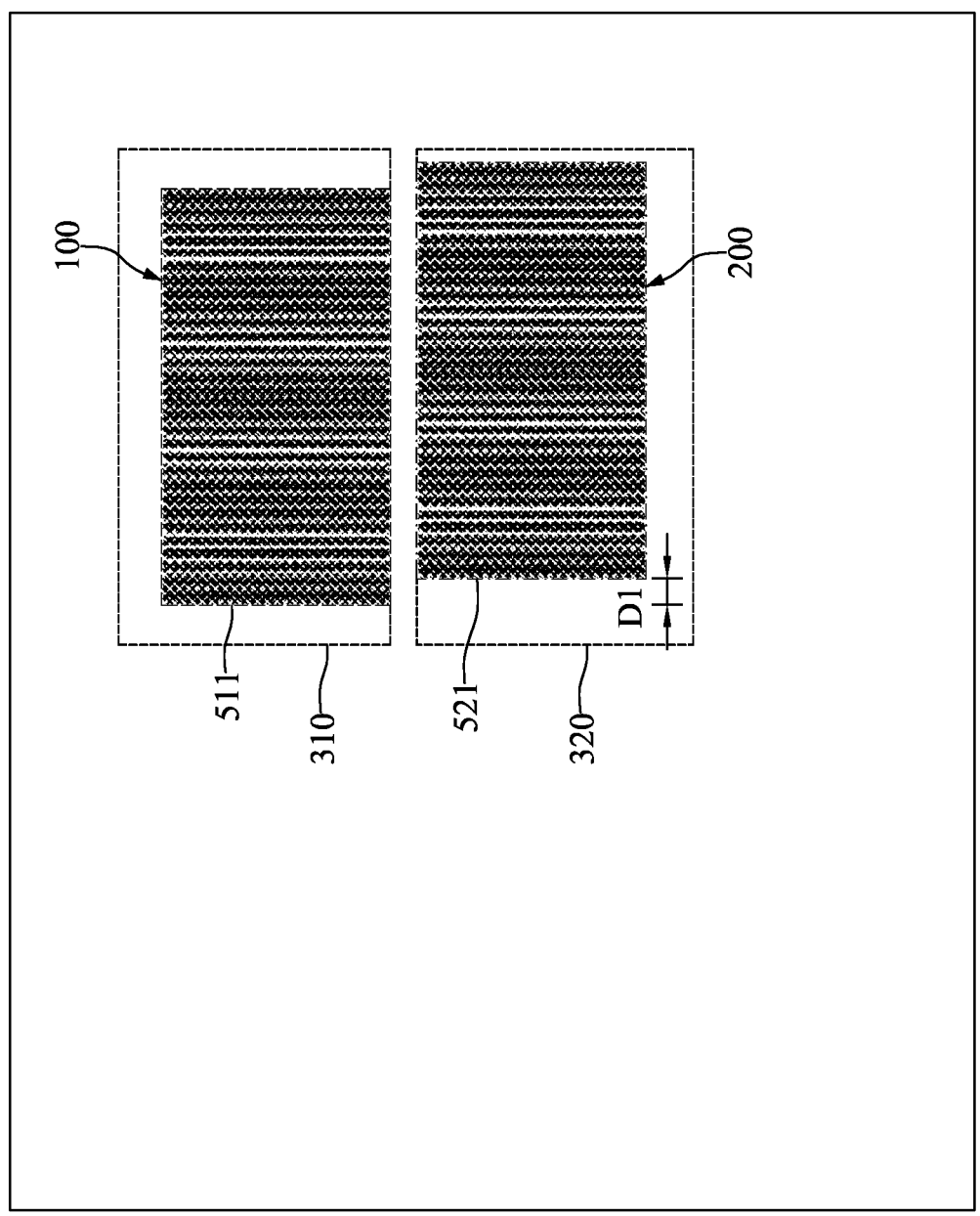
FIG. 15 illustrates, in a schematic top-view diagram, interference patterns of the first target and the second target in accordance with another embodiment of the present disclosure.

FIG. 14 illustrates, in a schematic top-view diagram, a lens 401 in accordance with another embodiment of the present disclosure. FIG. 15 illustrates, in a schematic top-view diagram, interference patterns of the first target 100 and the second target 200 in accordance with another embodiment of the present disclosure.

With reference to FIG. 14, the grating 300 configured on the lens 401 may include a first portion 310 and a second portion 320. The first portion 310 may correspond to the first position 511 and a pitch of the first portion 310 may be the same as the second pitch of the second target 200. The second portion 320 may correspond to the second position 521 and a pitch of the second portion 320 may be the same as the first pitch of the first target 100.

With reference to FIG. 15, the first portion 310 of the grating 300 may superpose the first target 100 to generate the interference pattern of the first target 100. The second portion 320 of the grating 300 may superpose the second target 200 to generate the interference pattern of the second target 200. With the intentionally deviation of the second target 200, the distortion created by the manufacturing process may be calibrated by using a calibrated magnification factor which is a ratio of the difference of misalignment of the relatively dark and relatively light regions in the interference pattern of the first target 100 and the interference pattern of the second target 200, over twice the distance D1. The overlay may be calculated by dividing the difference of center of gravity of the first target 100 and the second target 200 with the calibrated magnification factor.

One aspect of the present disclosure provides a target structure including a first target positioned on a first layer and including a plurality of line features spaced equally apart from each other according to a first pitch; and a second target positioned on a second layer and including a plurality of line features spaced equally apart from each other according to a second pitch. The first layer is different from the second layer. The first target and the second target do not overlap with each other. The first target is configured to generate an interference pattern when being illuminated by a lens including a grating configured thereon. The second target is configured to generate an interference pattern when being illuminated by the lens including the grating configured thereon.

Another aspect of the present disclosure provides a method for overlay measurement including forming a first target on a first layer; forming a second target on a second layer different from the first layer, wherein the first target and the second target are not overlapped to each other; positioning a lens including a grating configured thereon at a first location to completely overlap with the first target and the second target to generate an interference pattern of the first target and an interference pattern of the second target; and determining an overlay between the first target and the second target through the interference pattern of the first target and the interference pattern of the second target.

Another aspect of the present disclosure provides an image based metrology system for overlay measurement including a lens including a grating configured thereon; a light source to provide illumination to the lens; a detector to collect data; and a processing unit to process the data. The grating is configured to overlap with a first target having a first pitch and a second target having a second pitch to generate an interference pattern of the first target and an interference pattern of the second target.

Due to the design of the image based metrology system and the target of the present disclosure, the first target 100 and the second target 200 do not need to overlap with each other. Hence, the effect of process deviation for different layers to the targets may be reduced and a less complex design rule may be applied. In addition, the lens 401 may be shifted for multiple times to obtain multiple overlay results. All the overlay results may be used to validate each other and may be used to obtain an (average) overlay to fulfill statistical requirements.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first target positioned on a first layer and comprising a plurality of line features spaced equally apart from each other according to a first pitch; and
   a second target positioned on a second layer and comprising a plurality of line features spaced equally apart from each other according to a second pitch;
   wherein the first layer is different from the second layer;
   wherein the first target and the second target do not overlap with each other;
   wherein the first target is configured to generate an interference pattern when being illuminated by a lens comprising a grating configured thereon, wherein the grating superposes the first target to generate the interference pattern thereof;

wherein the second target is configured to generate an interference pattern when being illuminated by the lens comprising the grating configured thereon, wherein the grating superposes the second target to generate the interference pattern thereof;

wherein an overlay is determined by the interference pattern of the first target and the interference pattern of the second target without overlapping the first target and the second target with each other.

2. The semiconductor device of claim 1, wherein the first pitch and the second pitch are the same.

3. The semiconductor device of claim 2, wherein the first pitch is different from a pitch of the grating configured on the lens.

4. The semiconductor device of claim 2, wherein the first pitch is less than a pitch of the grating configured on the lens.

5. The semiconductor device of claim 2, wherein the first pitch is greater than a pitch of the grating configured on the lens.

6. The semiconductor device of claim 3, wherein the interference pattern of the first target comprises at least five parallel line features.

7. The semiconductor device of claim 6, wherein the first pitch, the second pitch, and the pitch of the grating configured on the lens are unresolvable to an image based metrology system comprising the lens.

8. The semiconductor device of claim 7, wherein a pitch of the interference pattern of the first target and a pitch of the interference pattern of the second target are resolvable to the image based metrology system comprising the lens.

9. The semiconductor device of claim 1, wherein the first pitch and the second pitch are different.

10. The semiconductor device of claim 1, wherein the overlay is determined based on a relative displacement between the first and second targets against the grating of the lens.

11. The semiconductor device of claim 10, wherein the relative displacement of the interference pattern generated for the first target is located on the first layer while the relative displacement of the interference pattern generated for the second target is located on the second layer.

12. The semiconductor device of claim 1, wherein the grating has a plurality of line features spaced equally apart from each other to parallel with the line features of the first target when the lens is placed over the first target and to parallel with the line features of the second target when the lens is placed over the second target.

13. The semiconductor device of claim 1, wherein the overlay between the first target and the second target is determined when comparing a center of gravity of the interference pattern of the first target and a center of gravity of the interference pattern of the second target.

* * * * *